(12) United States Patent
Kobayashi et al.

(10) Patent No.: US 10,204,872 B2
(45) Date of Patent: Feb. 12, 2019

(54) POWER MODULE AND POWER CONVERSION APPARATUS HAVING A WARPAGE SUPPRESSION PORTION

(71) Applicant: Hitachi Automotive Systems, Ltd., Hitachinaka-shi, Ibaraki (JP)

(72) Inventors: Toshiyuki Kobayashi, Tokyo (JP); Takuro Kanazawa, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/515,924

(22) PCT Filed: Oct. 6, 2015

(86) PCT No.: PCT/JP2015/078285
§ 371 (c)(1),
(2) Date: Mar. 30, 2017

(87) PCT Pub. No.: WO2016/056532
PCT Pub. Date: Apr. 14, 2016

(65) Prior Publication Data
US 2017/0301633 A1 Oct. 19, 2017

(30) Foreign Application Priority Data
Oct. 6, 2014 (JP) .................. 2014-205359

(51) Int. Cl.
*H01L 23/29* (2006.01)
*H01L 23/00* (2006.01)
(Continued)

(52) U.S. Cl.
CPC ............ *H01L 23/562* (2013.01); *H01L 23/04* (2013.01); *H01L 23/051* (2013.01);
(Continued)

(58) Field of Classification Search
CPC . H01L 23/293; H01L 23/3142; H01L 23/562; H01L 25/0652; H01L 25/0655
See application file for complete search history.

(56) References Cited

U.S. PATENT DOCUMENTS

| 2008/0106160 A1 | 5/2008 | Yoshinari et al. |
| 2010/0134979 A1 | 6/2010 | Obiraki et al. |
| 2012/0228776 A1* | 9/2012 | Ohno ............ C23C 24/04 257/773 |

FOREIGN PATENT DOCUMENTS

| EP | 1 921 911 A1 | 5/2007 |
| JP | 2003-31765 A | 1/2003 |

(Continued)

OTHER PUBLICATIONS

International Search Report (PCT/ISA/210) issued in PCT Application No. PCT/JP2015/078285 dated Dec. 15, 2015 with English translation (three (3) pages).

(Continued)

*Primary Examiner* — Hoai V Pham
(74) *Attorney, Agent, or Firm* — Crowell & Moring LLP

(57) ABSTRACT

An object of the present invention is to provide a power module that secures a heat dissipation route and has increased reliability. A power module of the present invention includes a first circuit body having a first semiconductor element and a first conductor portion, a second circuit body having a second semiconductor element and a second conductor portion, a resin sealing material for sealing the first circuit body and the second circuit body, and a warpage suppression portion that is formed along an array direction of the first circuit body and the second circuit body and is formed to have greater rigidity than a sealing portion of the resin sealing material, wherein the warpage suppression portion is formed of the same material as a resin member of (Continued)

the resin sealing material and is formed to be thicker than the sealing portion of the resin sealing material.

12 Claims, 14 Drawing Sheets

(51) Int. Cl.
    *H01L 25/07*     (2006.01)
    *H01L 25/18*     (2006.01)
    *H01L 23/04*     (2006.01)
    *H01L 23/051*     (2006.01)
    *H01L 23/31*     (2006.01)
    *H01L 23/367*     (2006.01)
    *H01L 25/065*     (2006.01)

(52) U.S. Cl.
    CPC ........ *H01L 23/293* (2013.01); *H01L 23/3142* (2013.01); *H01L 23/367* (2013.01); *H01L 24/34* (2013.01); *H01L 24/37* (2013.01); *H01L 25/0652* (2013.01); *H01L 25/0655* (2013.01); *H01L 25/07* (2013.01); *H01L 25/18* (2013.01); *H01L 2224/371* (2013.01); *H01L 2224/37599* (2013.01); *H01L 2224/84801* (2013.01); *H01L 2924/00014* (2013.01); *H01L 2924/181* (2013.01); *H01L 2924/1815* (2013.01)

(56) References Cited

FOREIGN PATENT DOCUMENTS

| | | | |
|---|---|---|---|
| JP | 2004107495 A | * | 4/2004 |
| JP | 2006-66559 A | | 3/2006 |
| JP | 2008-118067 A | | 5/2008 |
| JP | 2010-129867 A | | 6/2010 |

OTHER PUBLICATIONS

Japanese-language Written Opinion (PCT/ISA/237) issued in PCT Application No. PCT/JP2015/078285 dated Dec. 15, 2015 (five (5) pages).

Japanese-language Office Action issued in counterpart Japanese Application No. 2014-205359 dated Mar. 27, 2018 with English translation (nine (9) pages).

* cited by examiner

POWER MODULE AND POWER CONVERSION APPARATUS HAVING A WARPAGE SUPPRESSION PORTION

TECHNICAL FIELD

The present invention relates to a power module and a power conversion apparatus, and more particularly to those for use in an electric power steering device.

BACKGROUND ART

Conventionally, a power module using a switching element for use in various fields often adopts a resin sealed structure for the purpose of an increase in reliability of an electronic component or an increase in manufacturability of a module. The amount of heat generation of a power module has a tendency to increase according to multi-functionalization, increased power output, and high density packaging of a power module. The power module of such a resin sealed structure covers a switching element-equipped conductor portion with resin and exposes a heat dissipation layer of the back surface in order to increase the heat dissipation property. Furthermore, surface contact with an external module attachment portion is provided through grease, insulation sheet or the like, so that a heat dissipation route for dissipating heat generated by the internal switching element to the outside is secured. When such a structure in which the reliability is maintained and the heat dissipation route can be secured is adopted, the heat generated by the switching element is thermally diffused by the heat dissipation layer and the heat can be effectively dissipated to the module attachment portion over a large area.

When the heat dissipation layer of the back surface is not exposed, but is overmolded with resin and resin having excellent heat conduction property is used, the usage of grease, insulation sheet, or the like, which is an insulation member, can be reduced. In addition, for example, as disclosed in PTL 1, when the heat is dissipated not only from one surface of the power module, but also from both surfaces to the outside, the heat dissipation performance can be increased and the size can be reduced.

CITATION LIST

Patent Literature

PTL 1: JP 2003-31765 A

SUMMARY OF INVENTION

Technical Problem

The sealed structure of a conventional power module is a structure in which only a surface equipped with a switching element is resin-sealed and the back surface, which is a heat dissipation layer, is exposed. Therefore, it is known that no little warpage generally occurs in the power module due to cure shrinkage through resin curing during manufacturing, resin shrinkage during cooling, expansion and shrinkage at environment temperatures in practical use, or the like. When warpage that exceeds a permissible range occurs in the power module, a distance between the power module and an attachment body (heat sink) on which the power module is attached is increased and interferes with thermal contact, so that the heat generated in the semiconductor element cannot be diffused effectively.

It is an object of the present invention to provide a power module capable of maintaining the reliability and the manufacturability, and securing a heat dissipation route, and a power conversion apparatus.

Solution to Problem

A typical power module according to the present invention includes: a first circuit body including a first semiconductor element and a first conductor portion; a second circuit body including a second semiconductor element and a second conductor portion; a resin sealing material for sealing the first circuit body and the second circuit body; and a warpage suppression portion formed along an array direction of the first circuit body and the second circuit body, the warpage suppression portion being formed to have greater rigidity than a sealing portion of the resin sealing material.

Advantageous Effects of Invention

According to the present invention, a power module having favorable heat dissipation property with respect to a heat sink and increased reliability can be provided because a warpage suppression portion is formed and warpage deformation can be suppressed.

DESCRIPTION OF EMBODIMENTS

Figure 1:
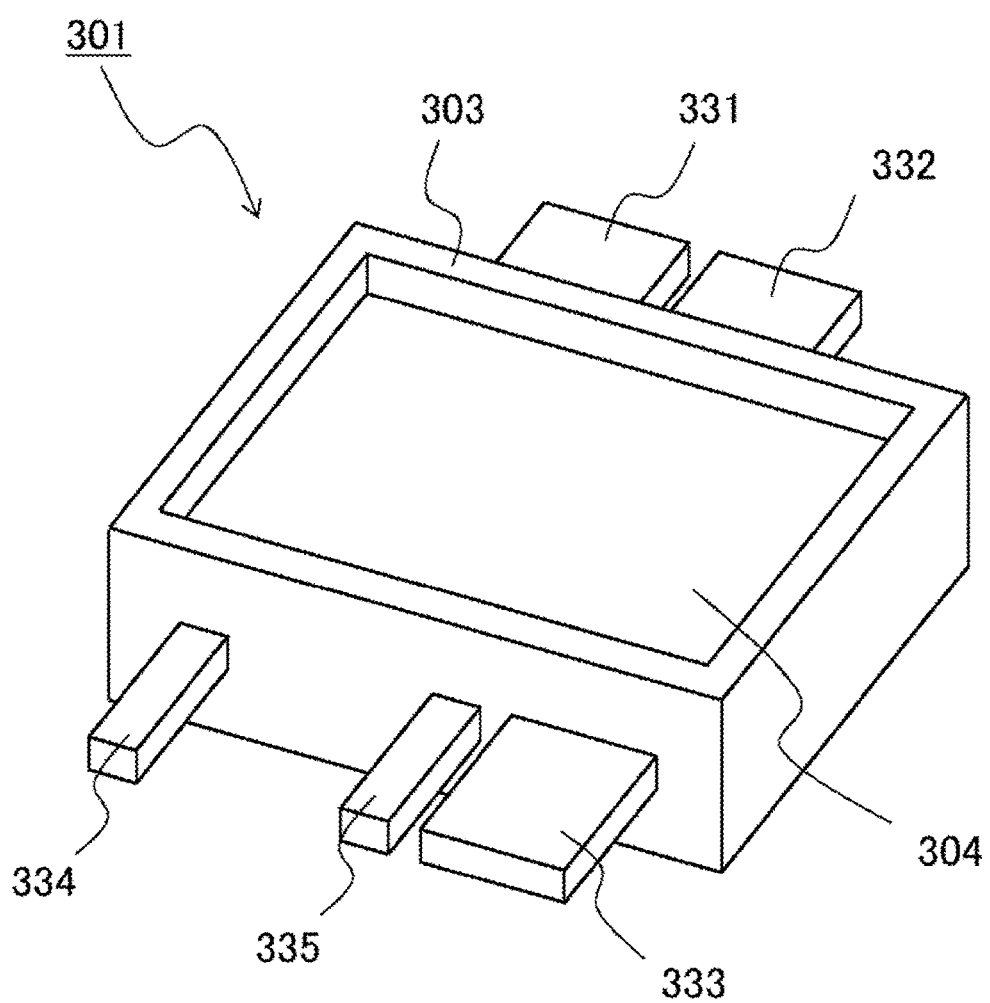
FIG. 1 is an external perspective view of a power module of Example 1.

In the following, embodiments of a power module and a power conversion apparatus according to the present invention are described with reference to the drawings. In the drawings, like elements are designated with like reference numerals, and the duplicate description is omitted.

Example 1

FIG. 1 is an external perspective view schematically illustrating a configuration of a power module 301 according to the present embodiment. The power module 301 includes sealing resin 304 for sealing a semiconductor element 302, a positive electrode wiring terminal 331, a negative electrode wiring terminal 332, a phase output terminal 333, and gate terminals 334 and 335. A structure of the power module 301 is described below in conjunction with FIGS. 2 to 4.

Figure 2:
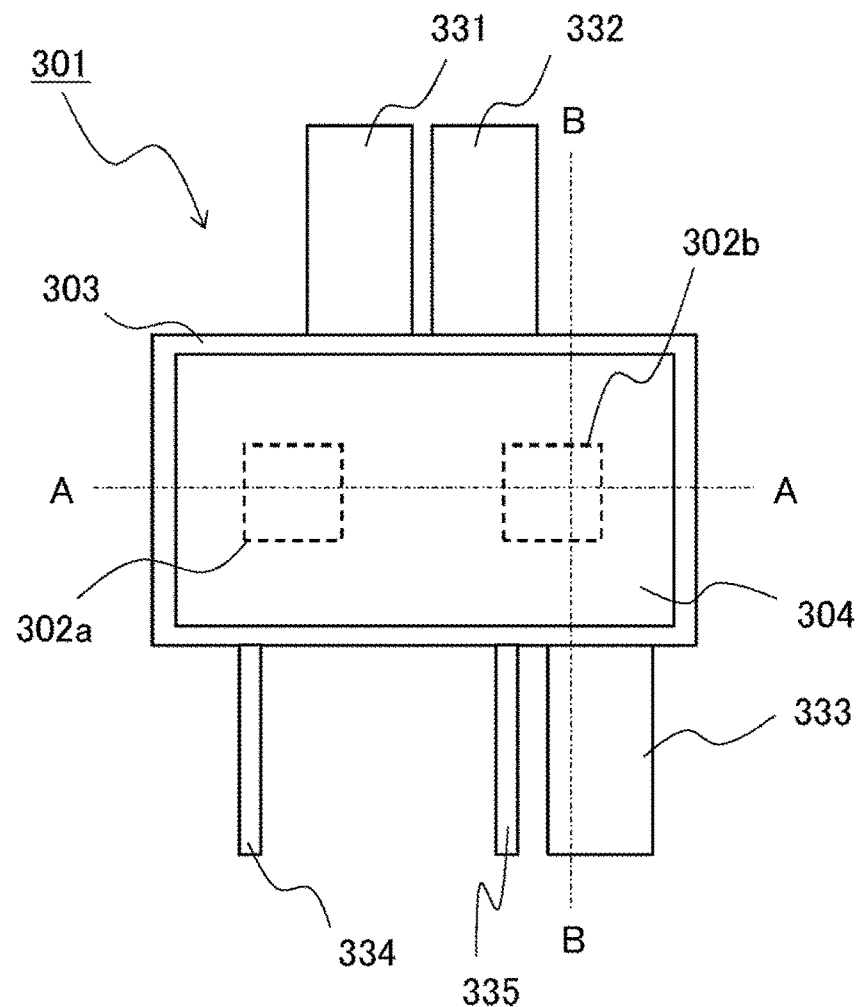
FIG. 2 is a front view of the power module of Example 1.

FIG. 2 is a front view of the power module 301 according to a first embodiment. The dotted lines in the drawing indicate the arrangement positions of the semiconductor elements 302.

Figure 3A:
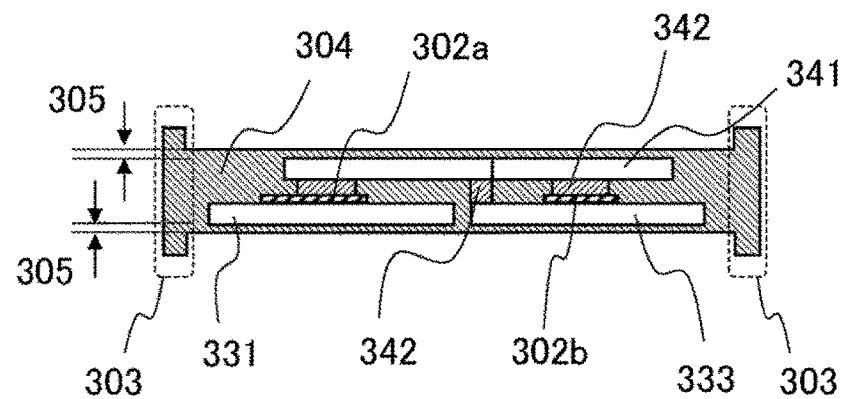
FIG. 3(a) FIG. 3A is a cross-sectional view of the power module of Example 1.
Figure 3B:
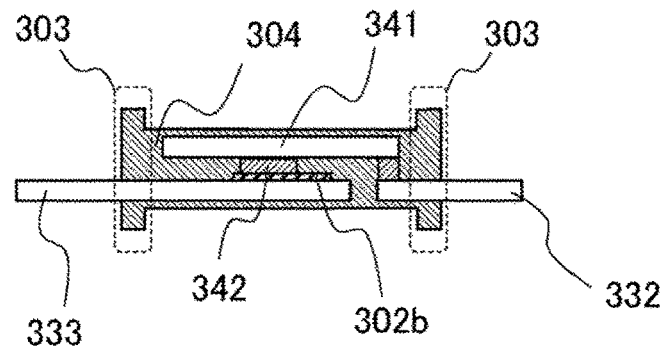
FIG. 3(b) FIG. 3B is a cross-sectional view of the power module of Example 1.
Figure 4:
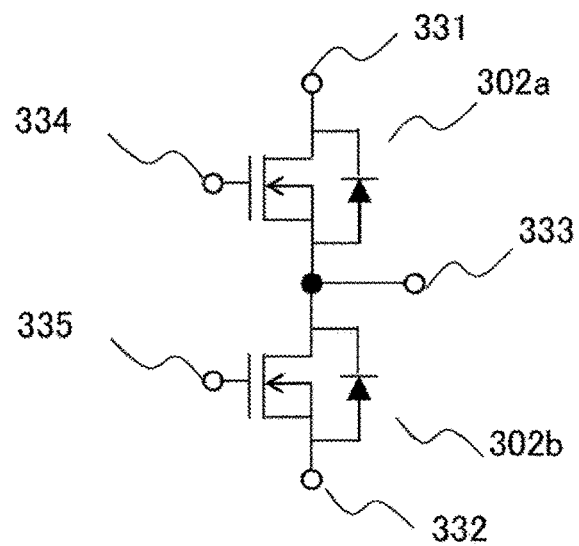
FIG. 4 is an internal circuit diagram of the power module provided on a power conversion apparatus of Example 1.

FIG. 3(a) illustrates a cross-sectional view cut along line A-A of FIG. 2. FIG. 3(b) illustrates a cross-sectional view cut along line B-B of FIG. 2. The power module 301 of the present example is configured such that two semiconductor elements 302a and 302b for driving in a controlled manner an external motor, which is not illustrated, lead frames (metallic terminals) 331 to 335, a substrate 341, and a spacer 342 are sealed with the sealing resin 304.

As the semiconductor element 302, for example, a MOS-FET (Metal-Oxide Semiconductor Field-Effect Transistor: metal oxide semiconductor field-effect transistor) or an IGBT (Insulated Gate Bipolar Transistor: insulated gate bipolar transistor) is used. The semiconductor element 302 is a bare chip where an Si chip is mounted in an exposed state. The upper surface and the lower surface of the semiconductor element 302 are connected to the lead frames with solder. Each semiconductor element 302 embedded in the power module 301 is connected to the lead frames to form a circuit body.

The lead frames 331 to 335 and the substrate 341 connected to the semiconductor elements are formed such that surfaces opposite from the surfaces on which the semiconductor elements are mounted are heat dissipation surfaces. In the power module 331 of the present example, such heat dissipation surfaces are covered with the insulating sealing resin 304. A thickness 305 (see FIG. 3(a)) of the sealing resin covering the heat dissipation surfaces is preferably 0.5 [mm] or less, more preferably 0.3 [mm] or less from the viewpoint of heat dissipation property. When the thickness 305 of the heat dissipation resin 304 is formed in the aforementioned manner, the insulation property can be secured without impairing the heat dissipation property.

When the semiconductor element 302 is covered with the resin, a stress on a joining member (e.g., solder) that occurs due to a difference in coefficient of linear expansion between the semiconductor element 302 and the metallic lead frames can be alleviated.

Examples of methods of sealing a semiconductor element with insulating resin include transfer molding, injection molding, potting. Transfer molding is desirable in terms of mass productivity and reliability. Examples of the material of the resin include epoxy-based resin.

The heat conductivity of the resin material is preferably 1 [W/(m·K)] or more, more preferably 3 [W/(m·K)] or more. The heat conductivity of the resin material is adjustable according to the type or the additive amount of filler. As the filler, a publicly known material such as alumina, boron nitride, and silica may be used, but the filler is not limited thereto. In particular, when a resin material having a heat conductivity of 2 [W/(m·K)] or more is used, even if heat dissipation grease or insulation sheet is reduced, great heat dissipation property from the power module to a heat sink can be obtained.

The sealing resin 304 effectively has a coefficient of thermal expansion of approximately 20 [ppm/° C.] or less, which is a value close to the coefficient of thermal expansion of a copper-based terminal, preferably has a coefficient of thermal expansion of about 6 to 20 [ppm/° C.].

The power semiconductor module 301 of the present example includes a warpage suppression portion 303. The warpage suppression portion 303 is formed on a peripheral edge portion of the sealing resin 304 that seals the semiconductor element 302 and the like. In FIG. 3(a), the warpage suppression portion 303 formed on the short sides of the power module 301 is illustrated. In FIG. 3(b), the warpage suppression portion 303 formed on the long sides of the power module 301 is illustrated. Here, the long side of the power module 301 is a side taken along the longitudinal direction, which is a direction parallel to an array direction of the semiconductor elements 302a and 302b.

The warpage suppression portion 303 of the present example is formed of the same material as the sealing resin 304 for sealing the semiconductor element 302 and is integrally formed with the sealing resin 304. In addition, the warpage suppression portion 303 is formed such that the thickness of the warpage suppression portion 303 in a direction normal to a main surface of the semiconductor element 302 is greater than the thickness of the sealing resin 304 in the same direction. In other words, the warpage suppression portion 303 is formed such that the warpage suppression portion 303 is protruded with respect to the main surface formed by the sealing resin 304 covering the heat dissipation surfaces of the lead frames. The main surface of the sealing resin 304 described herein is formed on both one side and the other side of the semiconductor element 302 in the present embodiment.

Thus, when the warpage suppression portion 303 is formed to be thicker than the sealing resin 304, the warpage suppression portion 303 having greater rigidity than the sealing resin 304 is formed. Such warpage suppression portion 303 having greater rigidity is formed along the array direction of the semiconductor elements 302a and 302b (i.e., the longitudinal direction of the power module illustrated in FIG. 2).

In addition, when the warpage suppression portion 303 is formed of the same material as the sealing resin 304 and is integrally formed with the sealing resin 304, the warpage suppression portion 303 can be formed at one time in a process of sealing the semiconductor element 302. Thus, in comparison to cases where the warpage suppression member 303 is separately formed and is then assembled, the number of components or the work processes are reduced.

As can be seen from a comparison between FIGS. 3(a) and 3(b), the sealing resin portion of the power module 301 is formed lengthwise in a direction in which the multiple semiconductor elements 304 are arrayed. In this case, the warpage in the power module 301 is likely to occur in the array direction of the semiconductor elements, which is a longitudinal direction, rather than in a lateral direction. The warpage in the power module occurs due to cure shrinkage through resin curing during manufacturing, resin shrinkage during cooling, expansion and shrinkage at environmental temperatures in practical use, or the like.

Figure 19A:
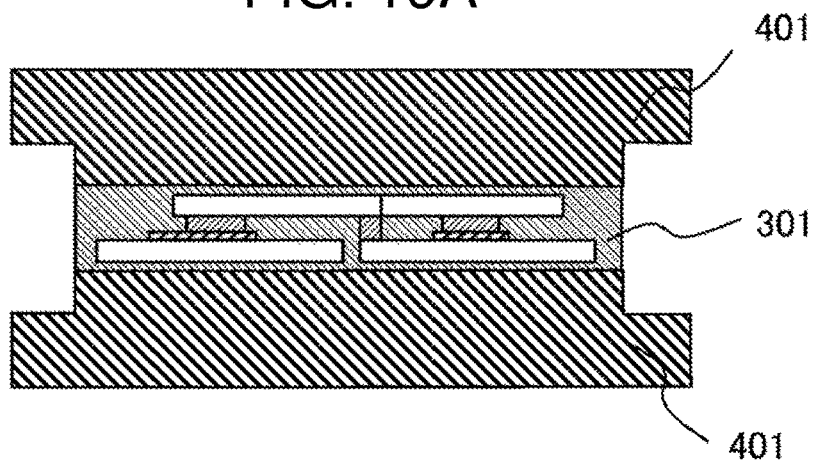
FIG. 19(a) FIG. 19A is a cross-sectional view where the power module of Comparative Example 1 is attached to heat sinks.
Figure 19B:
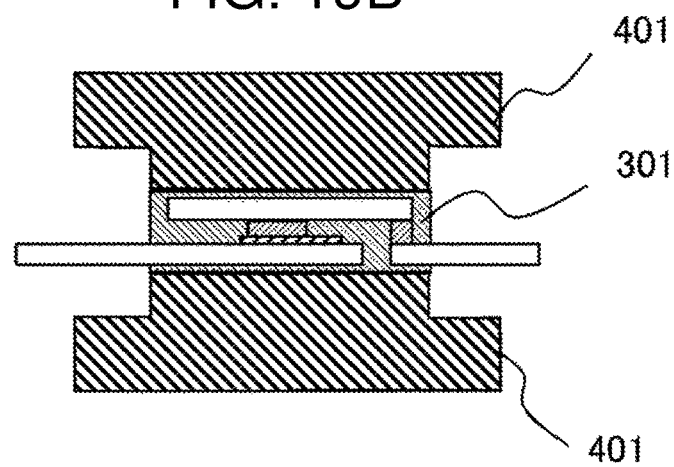
FIG. 19(b) FIG. 19B is a cross-sectional view where the power module of Comparative Example 1 is attached to the heat sinks.

Here, as a comparative example, a power module illustrated in FIGS. 17 to 19(a) and 19(b) is described. Unlike the power module of the present example, a power module illustrated in FIGS. 17 and 18(a) and 18(b) does not include the warpage suppression portion 303. In addition, FIGS. 19(a) and 19(b) are views illustrating a state where a power module 301 of the comparative example is attached to heat sinks 401. The heat sinks 401 form heat dissipation routes for thermal contact with the power module 301 in regions where the heat sinks 401 face metal terminals (lead frames) connected to semiconductor elements of the power module 301.

When warpage exceeding a permissible range occurs in the power module, a distance between the power module and the heat sinks is increased. Thus, thermal contact between the power module and the heat sinks suffers interference, preventing the heat generated by the semiconductor elements from being effectively dissipated. In addition, in some cases, in a stage where the power module is attached to an attachment body with a screw or the like, breakage of the semiconductor elements in the power module occurs due to the tightening torque. In addition, the occurrence of the warpage in the power module indicates that a stress is acted to the substrate itself. Therefore, the application of temperature cycle treatment, which is durability testing, in the aforementioned state can result in breakage of the power module due to a change of stress by temperature, leading to a reduction in reliability. Even in the structure where the power module includes a heat dissipation surface on both surfaces, no little warpage occurs. Therefore, such a reduction in heat dissipation property or such a reduction in reliability can occur.

With the power module of the present example, warpage in the longitudinal direction of the power module is suppressed. Therefore, favorable thermal contact with the heat sinks can be obtained, enabling maintenance of the reliability of the power module.

The warpage suppression portion formed on a peripheral edge portion of the sealing portion of the power module is formed at a different level with respect to the module main surface that thermally contacts the heat sinks. Thus, the rigidity of the peripheral edge portion of the sealing resin of the power module is increased. The level of the warpage suppression portion with respect to the main surface of the module is not limited as to the range for achieving the object of the present invention, but is preferably 0.5 [mm] or more, more preferably 1 [mm] or more. In addition, in the present example, the warpage suppression portion is formed not only along the longitudinal direction but also along the lateral direction. Therefore, the effect of suppressing warpage deformation is greater.

In addition, the sealing resin 304 used in the power module of the present example has a coefficient of thermal expansion (18 [ppm/° C.] which is a value substantially equal to the coefficient of thermal expansion (17 [ppm/° C.]) of copper, which forms the lead frames 331 to 335. Thus, warpage in the power module due to a difference in coefficient of thermal expansion can be suppressed, enabling further suppression of warpage in the power module.

FIG. 4(a) is a circuit configurational diagram of the power module 301 of the present embodiment.

Figure 5A:
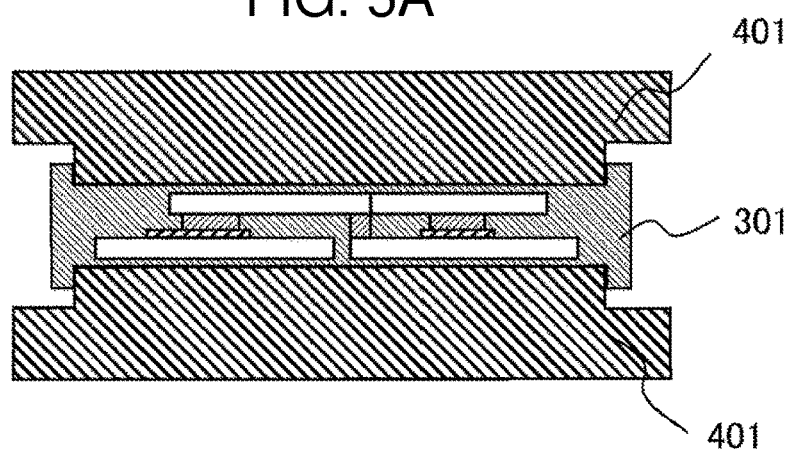
FIG. 5(a) FIG. 5A is a cross-sectional view where the power module of Example 1 is attached to heat sinks.
Figure 5B:
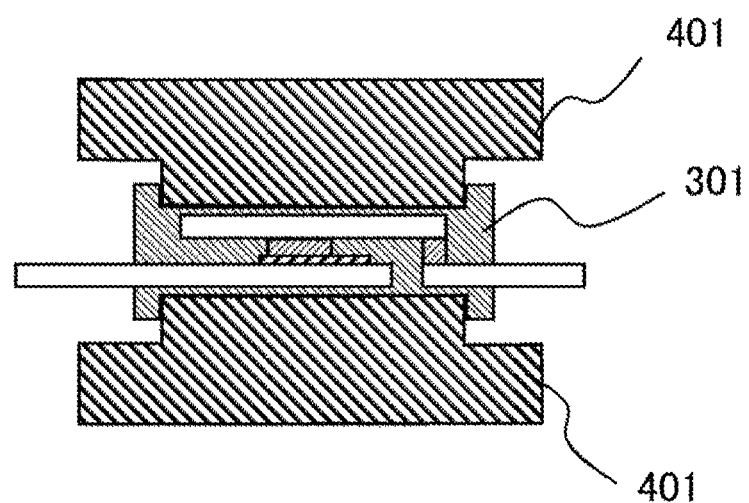
FIG. 5(b) FIG. 5B is a cross-sectional view where the power module of Example 1 is attached to the heat sinks.

FIGS. 5(a) and 5(b) are cross-sectional views illustrating a state where the power module 301 of the present embodiment is attached to the heat sinks 401. FIG. 5(a) is a cross-sectional view corresponding to FIG. 3(a). FIG. 5(b) is a cross-sectional view corresponding to FIG. 3(b).

The heat sinks 401 include protrusions to fit to the shape of the main surfaces forming the heat dissipation surfaces of the power module 301. In the present embodiment, the power module 301 is assembled on the heat sinks 401 without interposing heat dissipation grease or insulation sheet between the power module 301 and the heat sinks 401. The heat sinks 401 are preferably formed of metal or the like having favorable heat dissipation property. In addition, from the viewpoint of heat dissipation property, it is more preferable that the heat sinks 401 are integrally molded with the housing of a control device or the housing of a motor. In the present example, as will be described below, the heat sinks 401 are connected to a control device-side metal housing.

As compared to the power module of the comparative example (FIGS. 17 to 19(a) and 19(b)), warpage deformation in the power module of the present example is smaller. Therefore, the usage of heat dissipation member can be reduced while the heat dissipation property is maintained. As a result, the effect of a reduction in weight of the power conversion apparatus, a reduction in cost of the members, or the like is expected to be obtained.

In addition, regarding the warpage suppression portion 303 of the power module 301, the warpage suppression portion 303 and the heat dissipation surfaces of the power module form recesses that fit to the protrusions of the heat sinks 401. Therefore, the design of the warpage suppression portion 303 also determines the installation position of the power module 301 with respect to the heat sinks 401. Specifically, the warpage suppression portion 303 of the power module 301 also serves as a positioning member in relation to the protrusions of the heat sinks 401. For example, in FIG. 5(a), the warpage suppression portion 303 defines the arrangement position of the power module 301 in the array direction of the semiconductor elements 302a and 302b. Thus, the assemblability of the power module and the heat sinks is increased.

Figure 6:
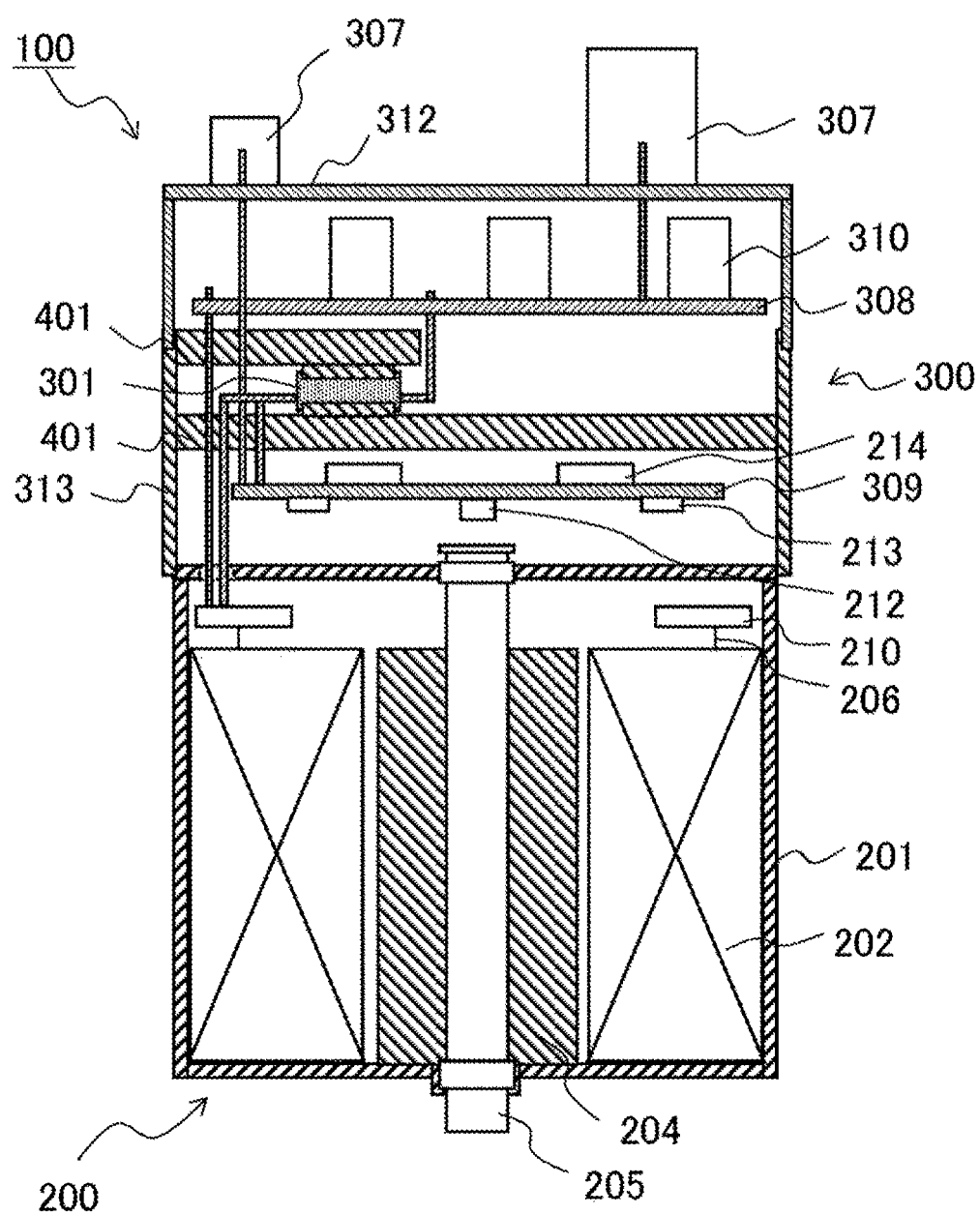
FIG. 6 is a cross-sectional view of the power conversion apparatus of Example 1.

FIG. 6 is an axial cross-sectional view illustrating an assembly state of a power conversion apparatus 100 where the power module 301 of the present example is assembled.

The power conversion apparatus 100 includes three power modules 301 (only one is illustrated) corresponding to an output of three phases, a motor 200, and a control device 300 including a motor drive circuit.

The motor 200 includes a stator 202 and a rotor 204. The stator winding of the stator 202 is formed of a three-phase winding with U, V, and W phases. For wiring, the stator winding is electrically connected with a terminal bus bar 210, which is molded with insulating resin. The rotor 204 is formed of a shaft 205 and a permanent magnet fixed to the outer circumference thereof. The rotor 204 is rotated by a rotating magnetic field generated as current is applied to the stator winding and by a bearing. Examples of the material of the permanent magnet include neodymium and ferrite. The components constituting the motor 200 are accommodated in a motor-side metal housing 201.

The power module 301 is attached to the heat sinks 401 thermally connected to an inverter-side metal housing 313. In the present example, the heat sinks 401 are fixed to both main surfaces of the power module 301. In addition, a power terminal of the power module 301 is connected to a power substrate 308, and a control terminal is connected to a control substrate 309.

A capacitor 310 is mounted on the power substrate 308. A position detection magnet 212, an electronic component 213, a microcomputer 214, and the like are mounted on the control substrate 309. The control substrate 309 is arranged on a side where the motor 200 is arranged with respect to the power module 301. The power substrate 308 is arranged on a side opposite from the side where the motor 200 is arranged with respect to the power module 301. In addition, connectors 307 are provided on a lid 312. The connectors 307 include one connected to the power substrate 308 and one connected to the control substrate 308.

In the power conversion apparatus 100 of the present embodiment, the heat generated by the power module 301 is dissipated from the inverter-side metal housing 313 to the motor-side metal housing 201. In addition, the heat generated by the power module 301 is also dissipated from the heat sinks 401 at the same time. Power modules that dissipate heat from both sides of a semiconductor element require effective heat dissipation to heat dissipation routes that are provided on both surface sides.

The power conversion apparatus of the present embodiment uses the power module 301 in which warpage deformation is small, and enables effective heat dissipation to the heat sinks arranged on both surface sides of the power module 301. As a result, an additional member for insulation or heat dissipation can be reduced, or the size in axial size of the power conversion apparatus can be reduced.

As described heretofore, the power module of the present example includes the warpage suppression portion and is capable of suppressing warpage deformation. Therefore, the power module with favorable heat dissipation property with respect to the heat sinks and high reliability can be provided. In addition, the usage of heat dissipation grease or insulation sheet can be reduced, leading to a reduction in cost. In addition, the warpage suppression portion is formed at a predetermined level from the main surfaces of the power module and an insulation distance (creepage distance) between the heat sinks and the lead frames is increased, resulting in an increase in the insulation reliability. When the power module of the present invention is assembled on the power conversion apparatus, there is an advantage that positioning with respect to the protrusions of the heat sinks becomes easy and the positional accuracy is increased.

In addition, in the power conversion apparatus of the present example, one surface of the power module placed on the inverter is in contact with the metal housing of the control device or the motor, and the other surface is in contact with the metal plate for heat dissipation. Therefore, the heat generated by the power module can be released from both surfaces, enabling realization of the power conversion apparatus having great heat dissipation property. As a result, the power conversion apparatus can be reduced in size.

Example 2

Figure 7A:
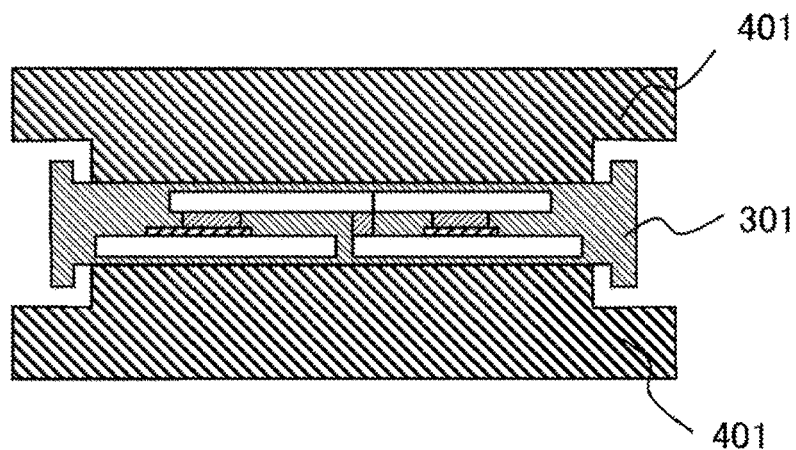
FIG. 7(a) FIG. 7A is a cross-sectional view where a power module of Example 2 is attached to heat sinks.
Figure 7B:
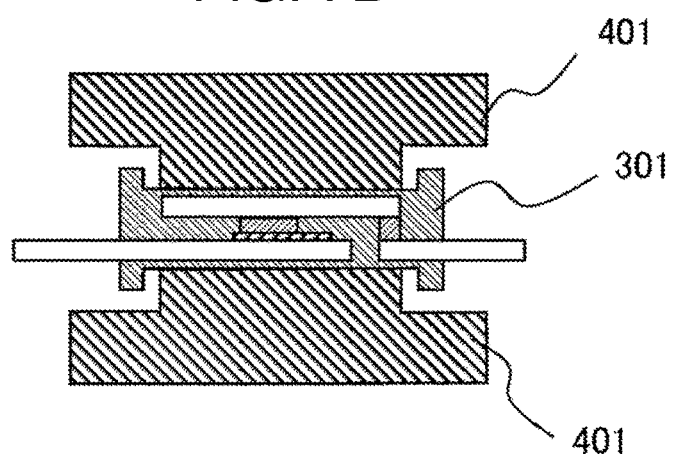
FIG. 7(b) FIG. 7B is a cross-sectional view where the power module of Example 2 is attached to the heat sinks.

FIGS. 7(a) and 7(b) illustrate an assembly structure of the power module and the heat sinks according to a second embodiment. A difference from the first embodiment is the shape of the heat sinks 401. In the present embodiment, the areas of the ends of the protrusions of the heat sinks 401 are smaller. Thus, the creepage distance is increased, and a power module with higher insulation reliability can be provided. In addition, when the power module of the present example is used in a power conversion apparatus, a power conversion apparatus having an axially reduced size can be provided.

Example 3

Figure 8A:
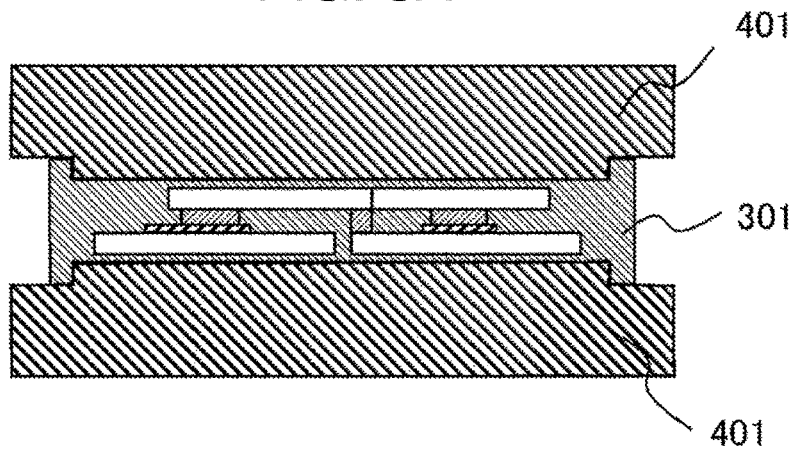
FIG. 8(a) FIG. 8A is a cross-sectional view where the power module of Example 2 is attached to the heat sinks.
Figure 8B:
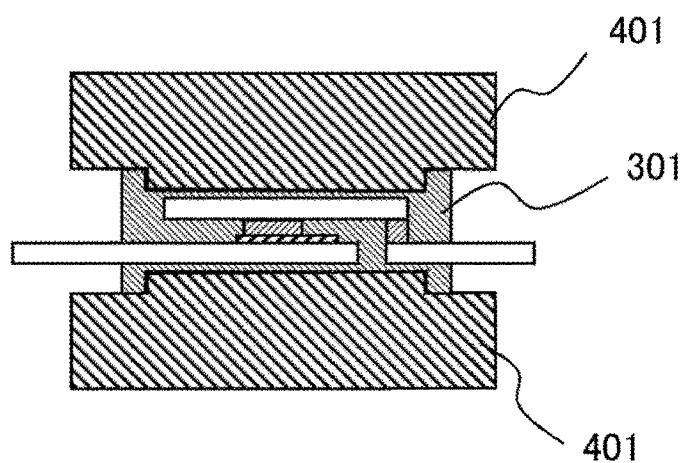
FIG. 8B is a cross-sectional view where the power module of Example 2 is attached to the heat sinks.

FIGS. 8(a) and 8(b) illustrate an assembly structure of the power module and the heat sinks according to a third embodiment. A difference from the first embodiment is the shape of the heat sinks 401. The power module of the present embodiment is in contact with the heat sinks 401 not only at the heat dissipation main surfaces of the module, but also at the warpage suppression portion 303.

Example 4

Figure 9:
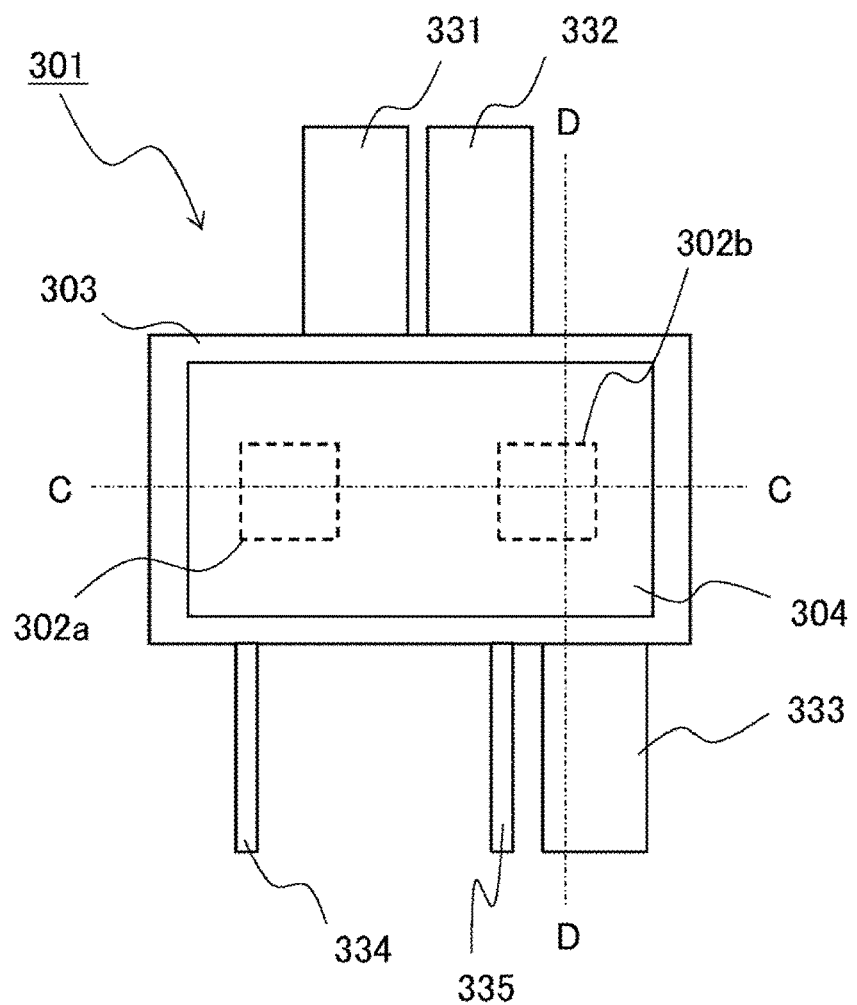
FIG. 9 is a front view of a power module of Example 3.
Figure 10A:
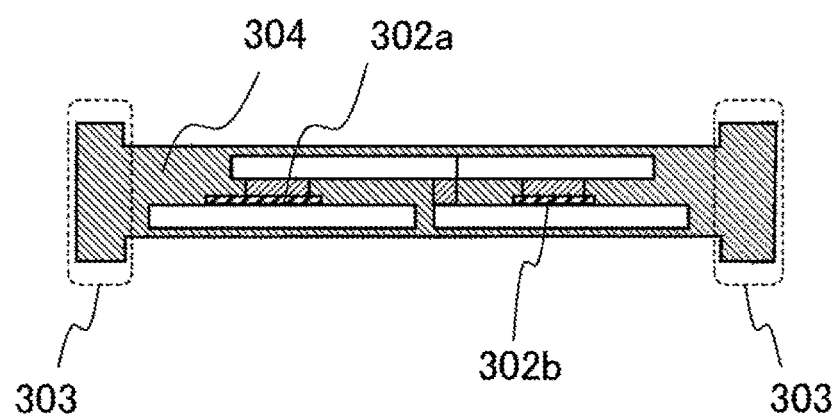
FIG. 10(a) FIG. 10A is a cross-sectional view of the power module of Example 3.
Figure 10B:
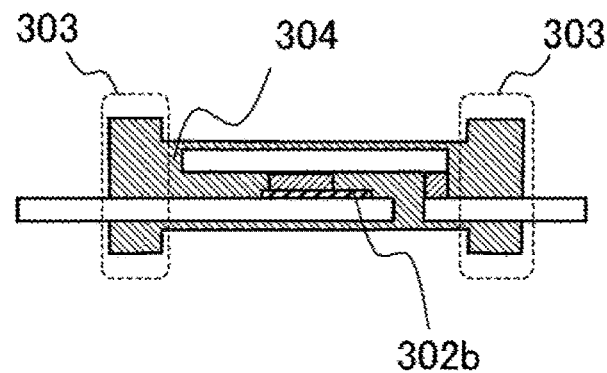
FIG. 10(b) FIG. 10B is a cross-sectional view of the power module of Example 3.

FIGS. 9 and 10(a) and 10(b) illustrate a configuration of the power module according to a fourth embodiment. FIG. 10(a) is a cross-sectional view cut along line C-C of FIG. 9. FIG. 10(b) is a cross-sectional view cut along line D-D of FIG. 9. A difference from the first embodiment is the shape of the warpage suppression portion 303. The power module of the present embodiment has a shape wider than the warpage suppression portion 303 of the first embodiment. Thus, the warpage suppression portion 303 may have increased rigidity. As a result, warpage across the power module 301 is more effectively suppressed, and a power module with high reliability can be provided. In addition, when the power module of the present embodiment is used in a power conversion apparatus, a power conversion apparatus having an axially reduced size can be provided.

Example 5

Figure 11:
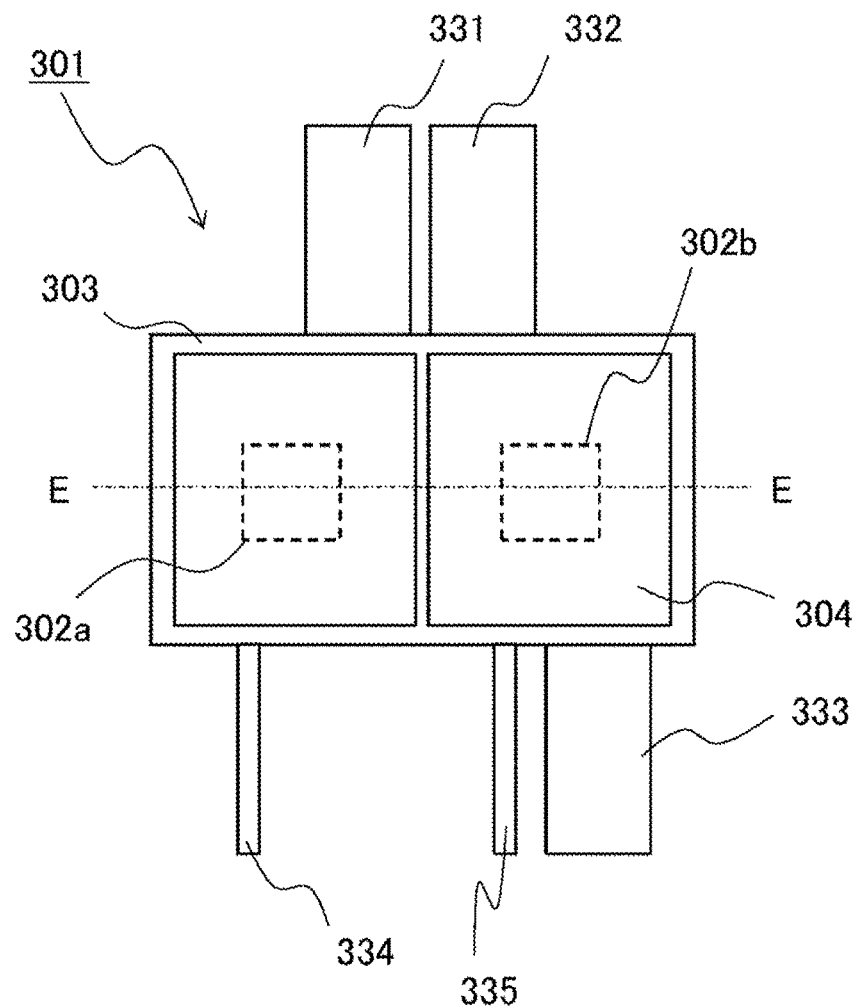
FIG. 11 is a front view of a power module of Example 4.
Figure 12:
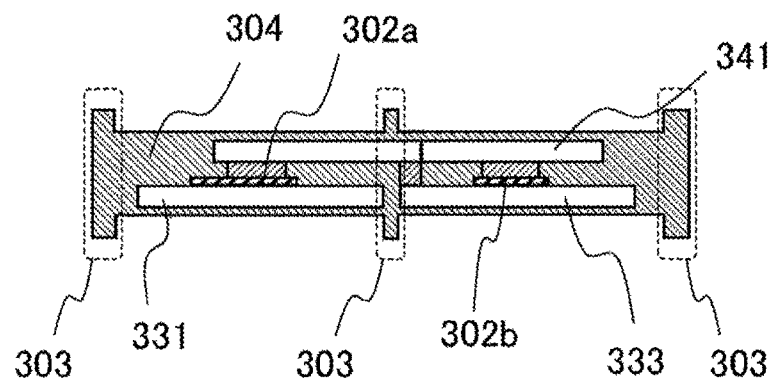
FIG. 12 is a cross-sectional view of the power module of Example 4.

FIGS. 11 and 12 illustrate a configuration of the power module according to a fifth embodiment. FIG. 12 is a cross-sectional view cut along line E-E of FIG. 11. A difference from the first embodiment lies in the point that the warpage suppression portion 303 is provided not only on a peripheral edge portion of the outer circumferential side, but also at an inner portion. The power module 303 of the present embodiment includes the warpage suppression portion 303 that is provided to pass substantially the middle between the two semiconductor elements 302a and 302b in a direction perpendicular to the array direction of the semiconductor elements 302a and 302b. When the warpage suppression portion 303 is formed between the two semiconductor elements, warpage across the power module can be effectively suppressed while the heat dissipation routes from the semiconductor elements to the heat sinks are secured.

In the present embodiment, the shape of the heat sinks 401 needs to be changed to fit to the shape of the warpage suppression portion 303. However, a power conversion apparatus can be further reduced in axial size.

Example 6

Figure 13:
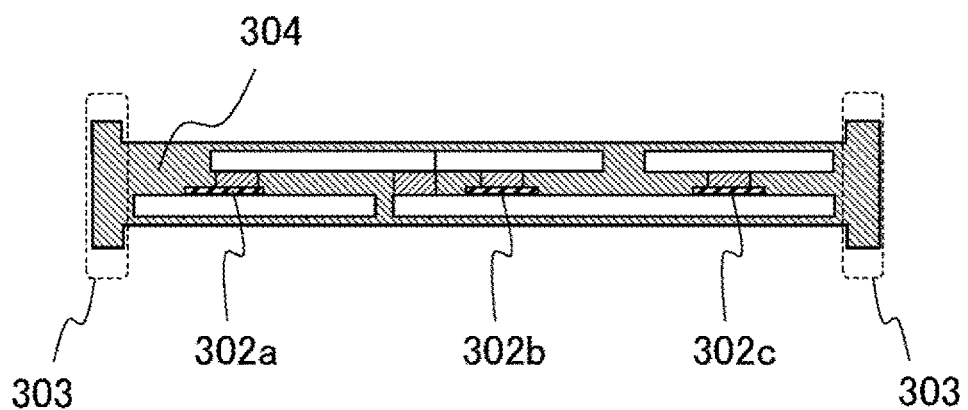
FIG. 13 is a cross-sectional view of a power module of Example 5.
Figure 14:
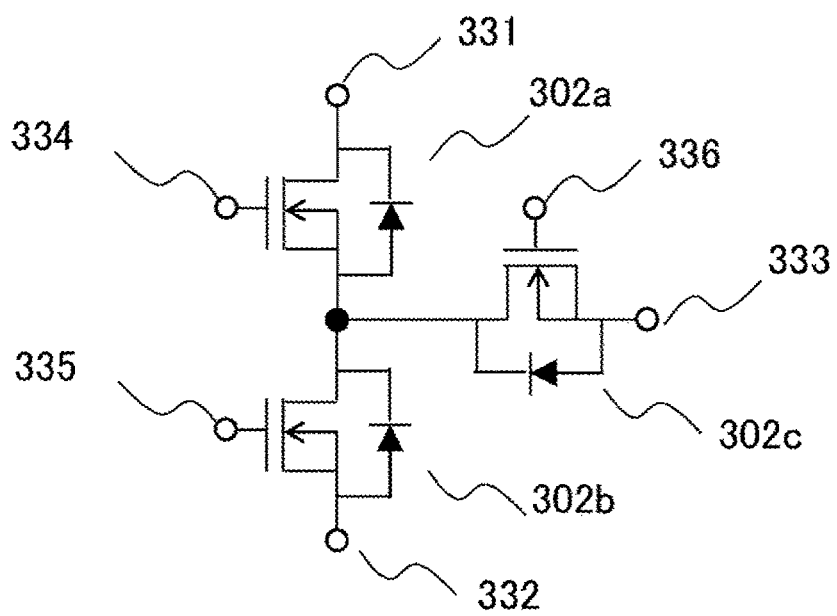
FIG. 14 is an internal circuit diagram of a power module provided on the power conversion apparatus of Example 1.

FIGS. 13 and 14 illustrate a configuration of the power module according to a sixth embodiment. In the present example, three semiconductor elements 302a, 302b, 302c are embedded in a single power module 301. A circuit configuration of the power module of the present embodiment is illustrated in FIG. 14.

Even in cases where there are three or more semiconductor elements as with the power module according to the present embodiment, the reliability of the power module can be increased when the warpage suppression portion 303 is provided as in the case of Example 1. In particular, in the power module according to the present embodiment, the three semiconductor elements are arranged in a row. Therefore, the length in the longitudinal direction is greater as compared to that of Example 1 in comparison to the length in the lateral direction of the power module. With such a module, the problem with reliability due to warpage in the module becomes more significant. Therefore, as compared to the conventional structure where the warpage suppression portion with great rigidity is not provided on a peripheral edge portion of the power module, high reliability can be secured.

Example 7

Figure 15:
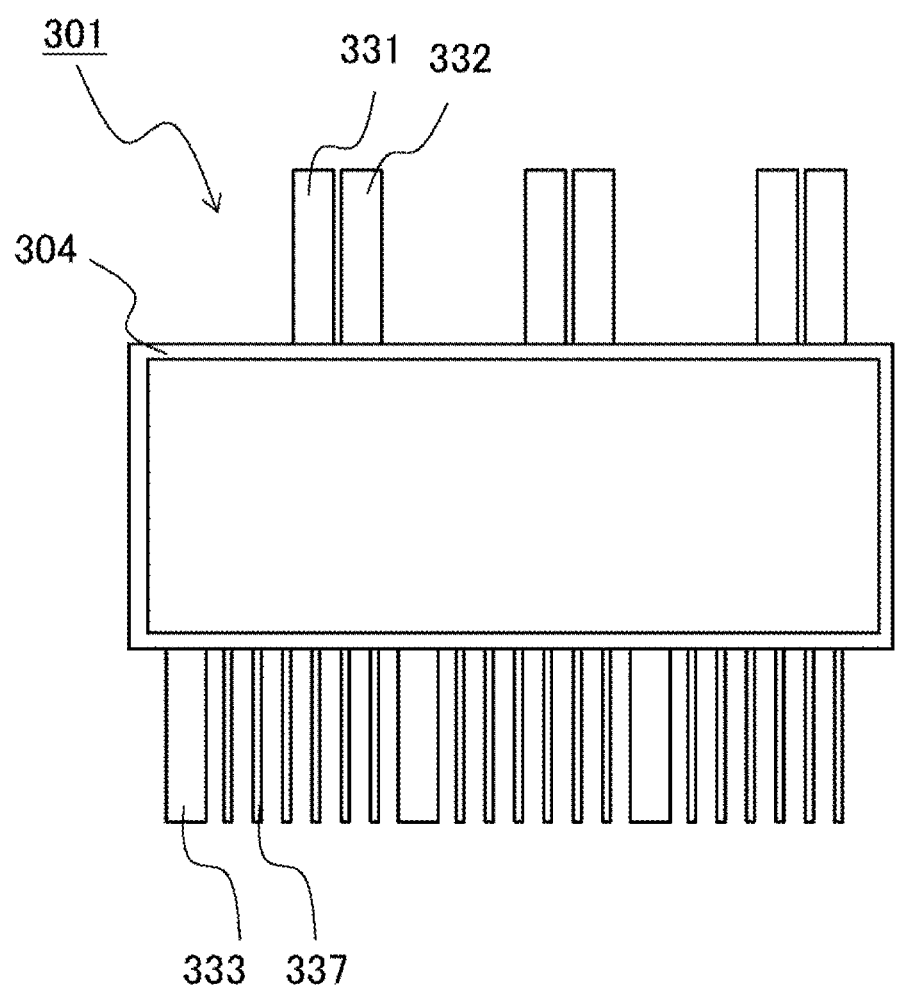
FIG. 15 is a front view of a power module of Example 6.
Figure 16:
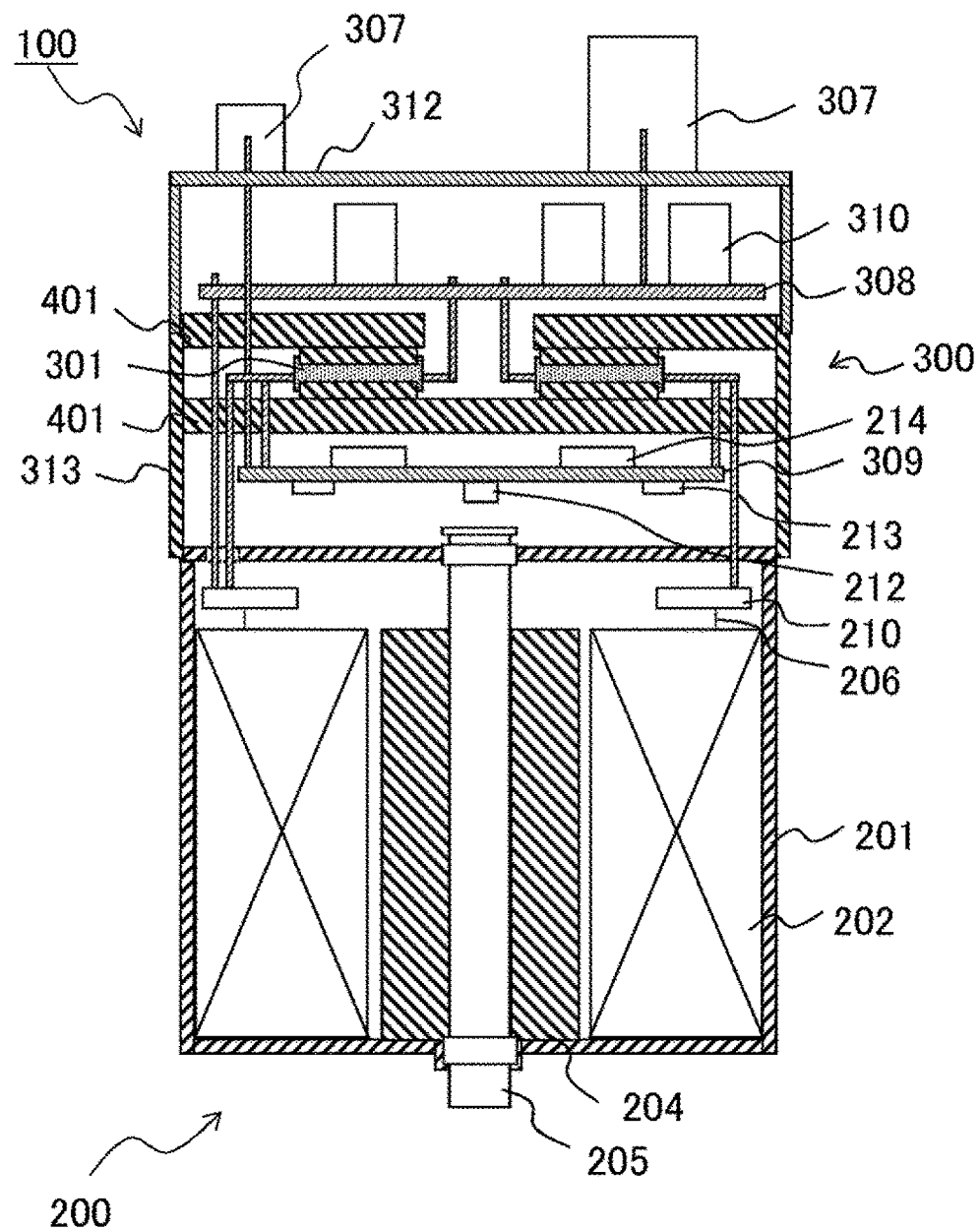
FIG. 16 is a cross-sectional view of a power conversion apparatus of Example 6.
Figure 17:
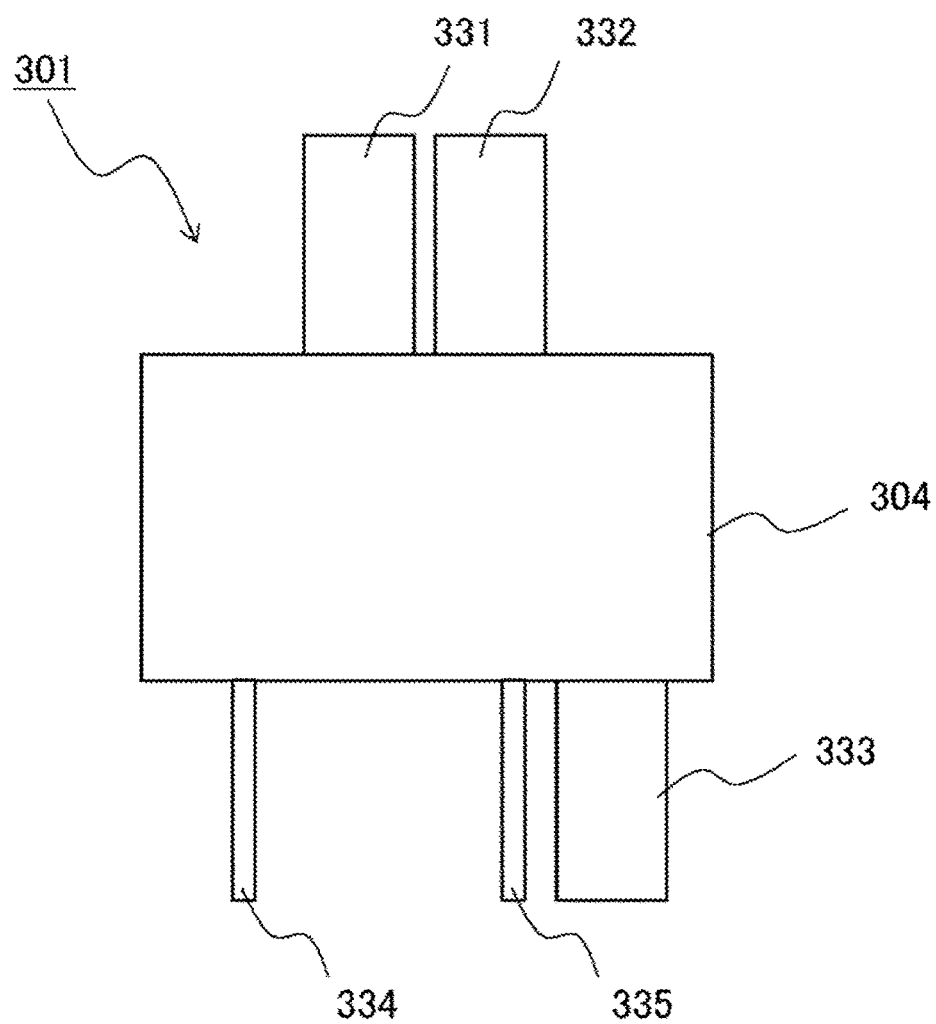
FIG. 17 is a front view of a power module of Comparative Example 1.
Figure 18A:
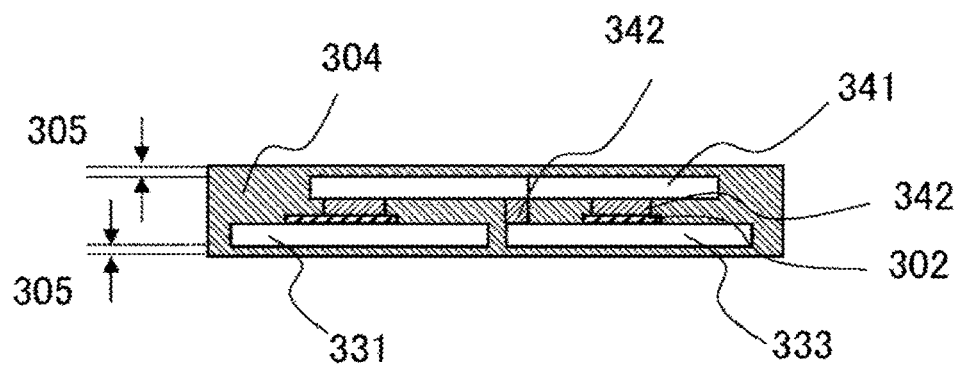
FIG. 18(a) FIG. 18A is a cross-sectional view of the power module of Comparative Example 1.
Figure 18B:
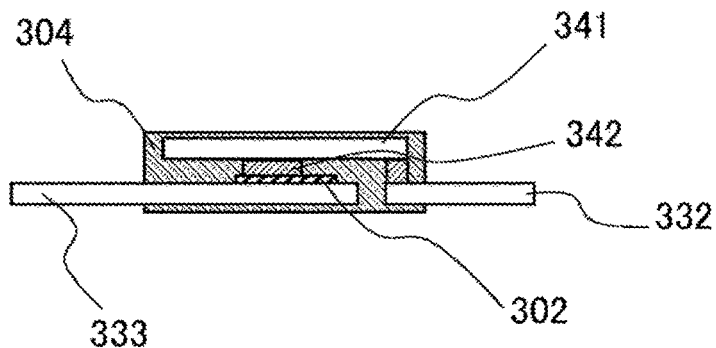
FIG. 18(b) FIG. 18B is a cross-sectional view of the power module of Comparative Example 1.

FIGS. 15 and 16 respectively illustrate configurations of the power module and the power conversion apparatus according to a seventh embodiment. In the power module of the present embodiment illustrated in FIG. 17, nine semiconductor elements are embedded. One power module of the present embodiment drives one three-phase stator winding. FIG. 16 is a view illustrating a state where the power module of the present embodiment is assembled on a power conversion apparatus. The power conversion apparatus 100 of the present embodiment includes two three-phase stator windings and two corresponding power modules 301. The first and second power modules independently drive the three-phase stator windings.

REFERENCE SIGNS LIST 100 power conversion apparatus
200 motor
201 motor-side metal housing
202 stator
204 rotor
205 shaft
206 stator winding output portion
210 terminal bus bar
212 position detection magnet
213 electronic component
214 microcomputer
300 control device
301 power module
302a to 302c semiconductor element
303 warpage suppression portion
304 sealing resin
305 resin thickness
307 connector
308 power substrate
309 control substrate
310 capacitor
312 lid
313 control device-side metal housing
331 positive electrode wiring terminal
332 negative electrode wiring terminal
333 phase output terminal
334, 335, 336 gate terminal
337 control terminal
341 substrate
342 spacer
401 heat sink

The invention claimed is:

1. A power module comprising:
a first circuit body including a first semiconductor element and a first conductor plate;
a second circuit body including a second semiconductor element and a second conductor plate;
a resin sealing material for sealing the first circuit body and the second circuit body; and
a warpage suppression portion formed along an array direction of the first circuit body and the second circuit body, the warpage suppression portion being formed to have greater rigidity than a sealing portion of the resin sealing material;
wherein the resin sealing material has a main upper surface and a main lower surface on outer peripheral sides of the first conductor plate and the second conductor plate,
wherein the warpage suppression portion is formed to be thicker than the sealing portion of the resin sealing material by projecting above the main upper surface and below the main lower surface.

2. The power module according to claim 1, wherein the warpage suppression portion is formed of a same material as the resin sealing material.

3. The power module according to claim 2, wherein the warpage suppression portion is formed on a peripheral edge portion of the resin sealing material.

4. The power module according to claim 3, wherein the warpage suppression portion is formed to include a portion which is formed along a direction perpendicular to an array direction of the first circuit body and the second circuit body.

5. The power module according to claim 4, wherein the first circuit body includes a third conductor plate arranged opposite the first conductor plate across the first semiconductor element, and the second circuit body includes a fourth conductor plate arranged opposite the second conductor plate across the second semiconductor element.

6. The power module according to claim 5, comprising a third circuit body including a third semiconductor element and the third conductor plate, wherein the third circuit body is arranged along an array direction of the first circuit body and the second circuit body, and the warpage suppression portion is formed along an array direction of the first circuit body, the second circuit body, and the third circuit body.

7. The power module according to claim 6, wherein the resin sealing material is formed of a material having a coefficient of thermal expansion equivalent to that of the first conductor plate and the second conductor plate.

8. The power module according to claim 7, wherein the resin sealing material has a heat conductivity of 2 W/(m·K) or more.

9. The power module according to claim 1, wherein the resin sealing material seals upper and side surfaces of the first circuit body and upper and side surfaces of the second circuit body.

10. A power conversion apparatus comprising:
a power module including:
a first circuit body including a first semiconductor element and a first conductor plate;
a second circuit body including a second semiconductor element and a second conductor plate;
a resin sealing material for sealing the first circuit body and the second circuit body; and
a warpage suppression portion formed along an array direction of the first circuit body and the second circuit body, the warpage suppression portion being formed to have greater rigidity than a sealing portion of the resin sealing material;

wherein the resin sealing material has a main upper surface and a main lower surface on outer peripheral sides of the first conductor plate and the second conductor plate, wherein the warpage suppression portion is formed to be thicker than the sealing portion of the resin sealing material by projecting above the main upper surface and below the main lower surface; and a heat sink arranged opposite the first conductor plate and the second conductor plate.

11. The power conversion apparatus according to claim 10, wherein the warpage suppression portion defines an arrangement position of the power module with respect to the heat sink in an in-plane direction perpendicular to an array direction of the heat sink and the power module.

12. The power conversion apparatus according to claim 10, wherein the resin sealing material seals upper and side surfaces of the first circuit body and upper and side surfaces of the second circuit body.

\* \* \* \* \*